(12) United States Patent
Takenaga et al.

(10) Patent No.: US 9,786,812 B2
(45) Date of Patent: Oct. 10, 2017

(54) LIGHT EMITTING ELEMENT AND LIGHT EMITTING DEVICE

(71) Applicant: NICHIA CORPORATION, Anan-shi, Tokushima (JP)

(72) Inventors: Koichi Takenaga, Tokushima (JP); Keiji Emura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/204,395

(22) Filed: Jul. 7, 2016

(65) Prior Publication Data

US 2017/0033262 A1 Feb. 2, 2017

(30) Foreign Application Priority Data

Jul. 30, 2015 (JP) .................................. 2015-150828
May 19, 2016 (JP) .................................. 2016-100165

(51) Int. Cl.

| H01L 33/20 | (2010.01) |
|---|---|
| H01L 33/38 | (2010.01) |
| H01L 33/50 | (2010.01) |
| H01L 33/58 | (2010.01) |
| H01L 33/40 | (2010.01) |

(Continued)

(52) U.S. Cl.
CPC .............. *H01L 33/20* (2013.01); *H01L 33/38* (2013.01); *H01L 33/382* (2013.01); *H01L 33/50* (2013.01); *H01L 33/58* (2013.01); *H01L 33/387* (2013.01); *H01L 33/405* (2013.01); *H01L 33/44* (2013.01); *H01L 33/62* (2013.01)

(58) Field of Classification Search
CPC ......... H01L 33/20; H01L 33/50; H01L 33/58; H01L 33/38
See application file for complete search history.

(56) References Cited

U.S. PATENT DOCUMENTS 9,130,127 B2 * 9/2015 Katsuno .................. H01L 33/22
2011/0266579 A1 11/2011 Nagai
(Continued)

FOREIGN PATENT DOCUMENTS

| EP | 2860778 A1 | 4/2015 |
|---|---|---|
| JP | 2006-203058 A | 8/2006 |

(Continued)

OTHER PUBLICATIONS

Extended European Search Report of the corresponding European Patent Application No. 16178547.2, dated Dec. 23, 2016.

*Primary Examiner* — Roy Potter
*Assistant Examiner* — Paul Patton
(74) *Attorney, Agent, or Firm* — Global IP Counselors, LLP

(57) ABSTRACT

A light emitting element with a hexagonal planar shape, has: an n-side semiconductor layer; a p-side semiconductor layer provided on the n-side semiconductor layer; a plurality of holes that are provided to an area excluding three corners at mutually diagonal positions of the p-side semiconductor layer in plan view, and expose the n-side semiconductor layer; a first p-electrode provided in contact with the p-side semiconductor layer; second p-electrodes provided to three corners on the first p-electrode; and an n-electrode that is provided on the first p-electrode and is electrically connected to the n-side semiconductor layer through the plurality of holes.

18 Claims, 17 Drawing Sheets

(51) Int. Cl.
*H01L 33/44* (2010.01)
*H01L 33/62* (2010.01)

(56) References Cited

U.S. PATENT DOCUMENTS

| | | |
|---|---|---|
| 2012/0049219 A1 | 3/2012 | Kamiya et al. |
| 2013/0176750 A1 | 7/2013 | Ray et al. |
| 2014/0183586 A1 | 7/2014 | Kamiya et al. |
| 2015/0098224 A1 | 4/2015 | Hong et al. |
| 2015/0179873 A1 | 6/2015 | Wunderer et al. |

FOREIGN PATENT DOCUMENTS

| | | |
|---|---|---|
| JP | 2008-524831 A | 7/2008 |
| JP | 2010-251481 A | 11/2010 |
| JP | 2012-069909 A | 4/2012 |
| JP | 2014-022607 A | 2/2014 |
| JP | 2015-076617 A | 4/2015 |
| WO | 2006-068297 A1 | 6/2006 |
| WO | 2015-077623 A1 | 5/2015 |

* cited by examiner

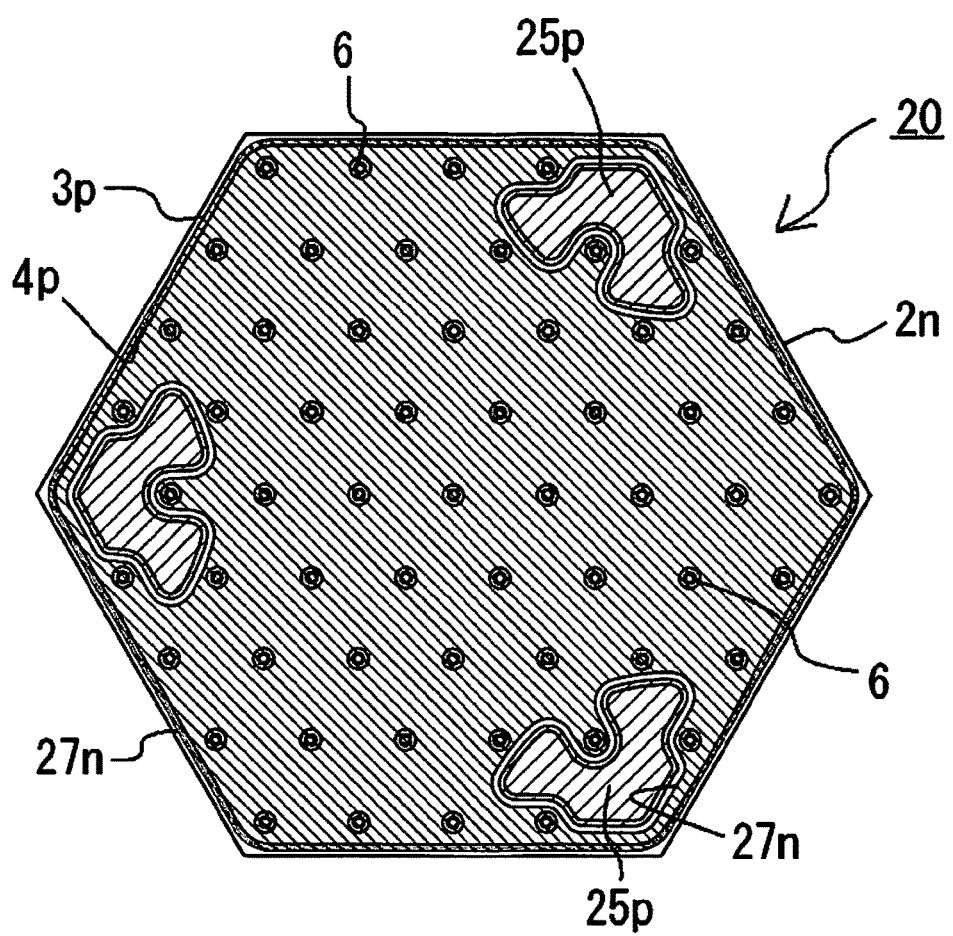

LIGHT EMITTING ELEMENT AND LIGHT EMITTING DEVICE

CROSS-REFERENCE TO RELATED APPLICATIONS

This application claims priority to Japanese Patent Applications No. 2015-150828 and No. 2016-100165 filed on Jul. 30, 2015 and May 19, 2016. The entire disclosures of Japanese Patent Applications No. 2015-150828 and No. 2016-100165 are hereby incorporated herein by reference.

BACKGROUND

1. Technical Field

The present disclosure relates to a light emitting element and a light emitting device using the light emitting element.

2. Description of Related Art

Considerable research has gone into light emitting elements used to obtain uniform emission with good light extraction efficiency (for example, JP2010-251481A, JP2006-203058A and JP2008-524831A).

SUMMARY

An object of the present disclosure is to provide a light emitting element with which light emission is kept to a minimum at the corners of the light emitting element and in the surrounding areas, and light extraction from the upper surface is further enhanced, as well as a light emitting device in which this element is used.

The light emitting element with a hexagonal planar shape, has: an n-side semiconductor layer; a p-side semiconductor layer provided on the n-side semiconductor layer; a plurality of holes that are provided to an area excluding three corners at mutually diagonal positions of the p-side semiconductor layer in plan view, and expose the n-side semiconductor layer; a first p-electrode provided in contact with the p-side semiconductor layer; second p-electrodes provided to three corners on the first p-electrode; and an n-electrode that is provided on the first p-electrode and is electrically connected to the n-side semiconductor layer through the plurality of holes.

Another light emitting element with a hexagonal planar shape, has: an n-side semiconductor layer; a p-side semiconductor layer provided on the n-side semiconductor layer; a plurality of holes that are provided to an area excluding two corners at the farthest positions of the p-side semiconductor layer in plan view, and expose the n-side semiconductor layer; a first p-electrode provided in contact with the p-side semiconductor layer; second p-electrodes provided to three corners on the first p-electrode; and an n-electrode that is provided on the first p-electrode and is electrically connected to the n-side semiconductor layer through the plurality of holes.

The light emitting device has: the light emitting element of the above, a base on which the light emitting element is provided, and a hemispherical light-transmissive member that covers the light emitting element.

According to an embodiment of the present invention, there is provided a light emitting element with which light emission can be kept to a minimum at the corners of the light emitting element and in the surrounding areas, and light extraction from the upper surface can be further enhanced, as well as a light emitting device in which this element is used.

BRIEF DESCRIPTION OF DRAWINGS

FIG. 2 is a schematic plan view of the configuration of the light emitting element according to another embodiment of the present invention;

DETAILED DESCRIPTION

In the following description, terms will be used to indicate particular directions or positions as needed (such as "upper," "lower," "left," "right," and other terms that include these).

The use of these terms is intended to facilitate an understanding of the invention through reference to the drawings, and the technological scope of the present invention is not limited by the meanings of these terms. Numbers that are the same in two or more drawings refer to the same portion or member. A number of embodiments will be described in order to facilitate an understanding of the invention, but these embodiments are not mutually exclusive, and parts that can be shared will apply to the description of other embodiments.

Embodiment 1: Light Emitting Element

Figure 1A:
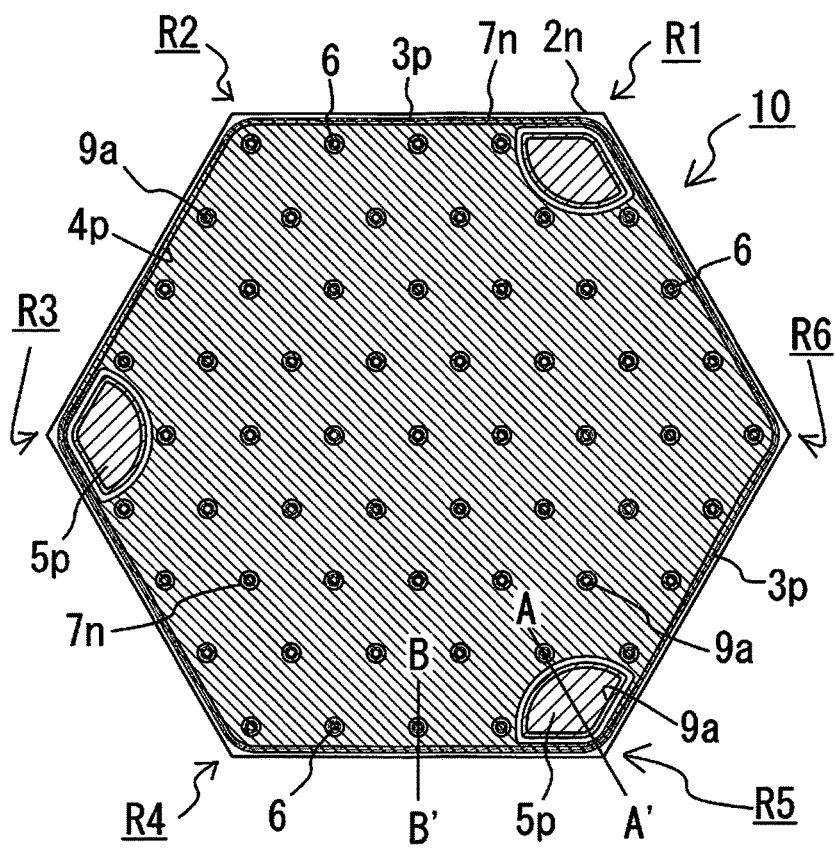
FIG. 1A is a schematic plan view of the configuration of the light emitting element according to an embodiment of the present invention.
Figure 1B:
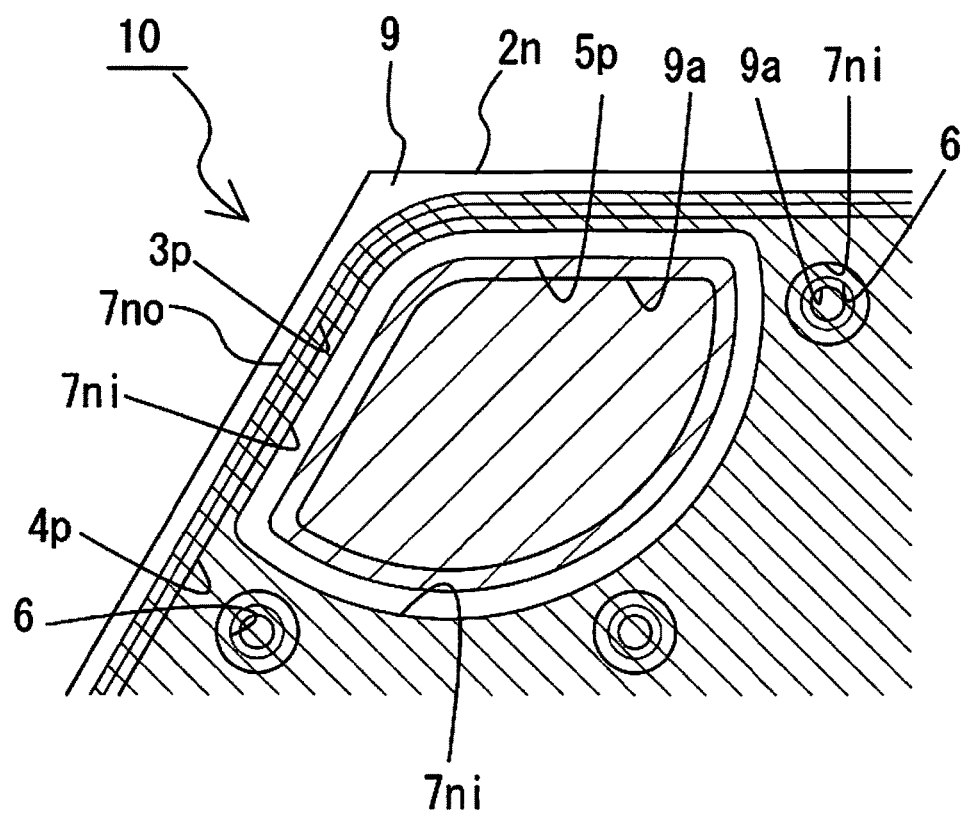
FIG. 1B is an enlarged plan view of the main parts of the light emitting element in FIG. 1A.
Figure 1C:
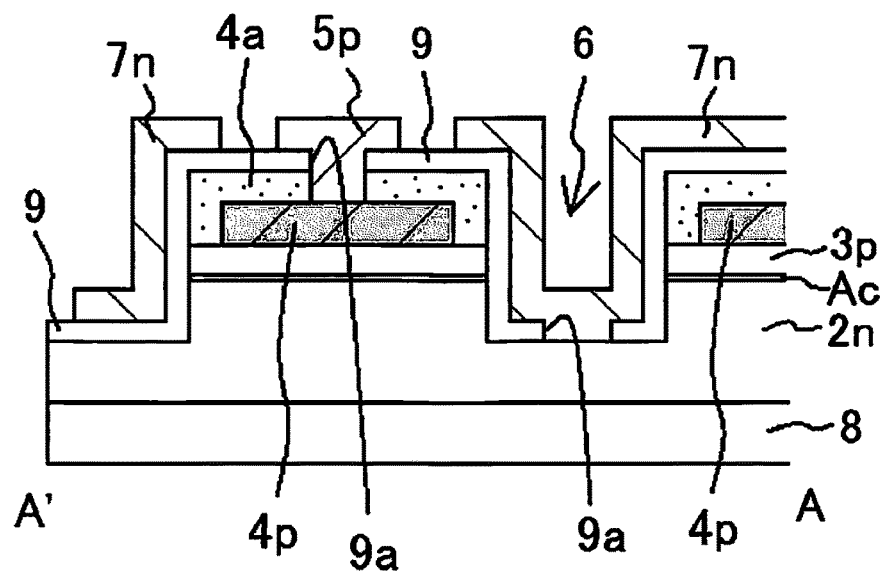
FIG. 1C is a cross sectional view along the A-A' line in FIG. 1A.
Figure 1D:
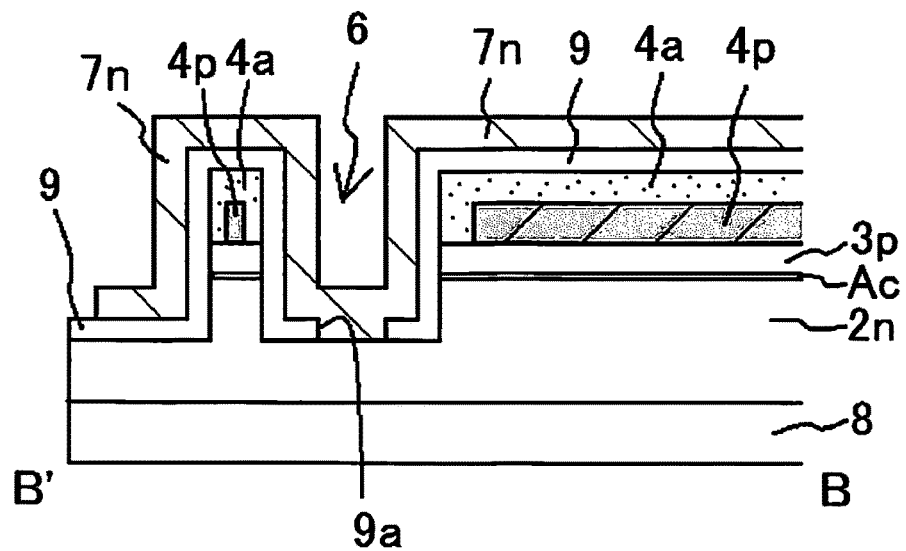
FIG. 1D is a cross sectional view along the B-B' line in FIG. 1A.

As shown in FIG. 1A, the light emitting element 10 in this embodiment is hexagonal in plan view. As shown in FIGS. 1A and 1B, the light emitting element 10 has an n-side semiconductor layer 2n, a p-side semiconductor layer 3p provided on the n-side semiconductor layer 2n, a plurality of holes 6 provided at specific locations in the p-side semiconductor layer 3p, a first p-electrode 4p provided in contacting with the p-side semiconductor layer 3p, second p-electrodes 5p that are provided on the first p-electrode 4p in corners R1, R3, and R5 in which the holes 6 are not disposed, and an n-electrode 7n that is electrically connected to the n-side semiconductor layer 2n via the holes 6. The holes 6 are provided in three corners that are at mutually diagonal positions of the p-side semiconductor layer in plan view, such as in the area excluding the corners R1, R3, and R5 in FIG. 1A (in other words, in the corners R2, R4, and R6 in FIG. 1A, in the areas adjacent to the sides, and the area to the inside of these).

The light emitting element 10 is such that the second p-electrodes 5p, which are connected to the outside, are disposed in the area of three corners, for example R1, R3, and R5, that are in mutually diagonal positions in the p-side semiconductor layer 3p. The holes 6 are provided in an area that excludes the three corners R1, R3, and R5 where the second p-electrodes are disposed, and the n-electrode in is electrically connected to the n-side semiconductor layer 2n via the holes 6. Consequently, of the current supplied to the semiconductor layer, the current supplied to the corners R1, R3, and R5 in which the second p-electrodes 5p are disposed can be reduced, while the current can be increased to the area other than these corners, that is, the areas adjacent to the sides of the p-side semiconductor layer where the holes 6 are disposed and the area to the inside of the corners R1, R3, and R5. As a result, light emission is kept to a minimum at the corners R1, R3, and R5 of the light emitting element 10 and the surrounding areas, and light extraction from the rest of the upper surface of the light emitting element 10 (and particularly the area to the inside surrounded by the corners R1, R3, and R5) can be further enhanced.

The planar shape of this light emitting element 10 is preferably that of a regular hexagon, but it is permissible for the angles of the six corners to vary at about 120 degrees±5 degrees. The sides that make up the hexagon are usually straight lines, but may be somewhat curved or bent, depending on the machining precision of the semiconductor layer and so forth. Therefore, with the above in mind, the planar shape of the light emitting element encompasses a regular hexagonal shape as well as similar shapes.

This light emitting element whose planar shape is hexagonal has, for example, sides that are each about 300 to 2000 μm in length. In other words, the diagonal line linking the corners that are farthest apart is about 600 to 4000 μm in length. To put this another way, the surface area of the light emitting element is about 0.2 to 10 mm$^2$.

Semiconductor Layer

The semiconductor layer includes at least the n-side semiconductor layer 2n and the p-side semiconductor layer 3p. Preferably, an active layer is further included between these. The n-side semiconductor layer 2n and/or the p-side semiconductor layer 3p is preferably such that the planar shape of its outer periphery is hexagonal, so that the planar shape of the light emitting element will be hexagonal. However, the n-side semiconductor layer 2n and/or the p-side semiconductor layer 3p may also be such that there is a portion in which all or part of the layer in the film thickness direction has been removed from the inside and/or part of the outer periphery. Using the light emitting region (this corresponds to the active layer in this embodiment) as a reference, the semiconductor on the side where the n-electrode is connected is the n-side semiconductor layer 2n, and the semiconductor on the side where the p-electrode is connected is the p-side semiconductor layer 3p.

As the n-side semiconductor layer, the active layer and the p-side semiconductor layer, for example, a nitride semiconductor represented by $In_XAl_YGa_{1-X-Y}N$ (0≤X, 0≤Y, X+Y<1) can be used. Thickness and layer structure of each layer constituting the semiconductor layer can be used those known in the art.

The semiconductor layer is formed on a substrate for semiconductor growth. In the case where a nitride semiconductor as the semiconductor layer, a substrate made of sapphire ($Al_2O_3$) can be use.

Holes

The holes 6 are provided in an area that excludes three corners at mutually diagonal locations of the p-side semiconductor layer in plan view, and expose the n-side semiconductor layer.

Here, the phrase "corners at mutually diagonal locations" means that they are in locations across from each other, and not adjacent to each other. Also, "three corners at mutually diagonal locations" means every other corner in the case of a p-side semiconductor layer whose planar shape is hexagonal.

The holes 6 may be formed in any area of the p-side semiconductor layer, so long as they are provided to an area that excludes these three corners at mutually diagonal locations. In other words, when they are not even formed in three non-adjacent corners, then they may not be formed in four corners (including three non-adjacent corners), or they may not be formed in five corners (including three non-adjacent corners), or they may not be formed in any of the corners. Again in these cases, the holes are preferably formed in the area of the p-side semiconductor layer other than the corners, and particularly at least in the area to the inside surrounded by the three corners, as this increases the amount of light extraction from the upper surface of the light emitting element.

Figure 7A:
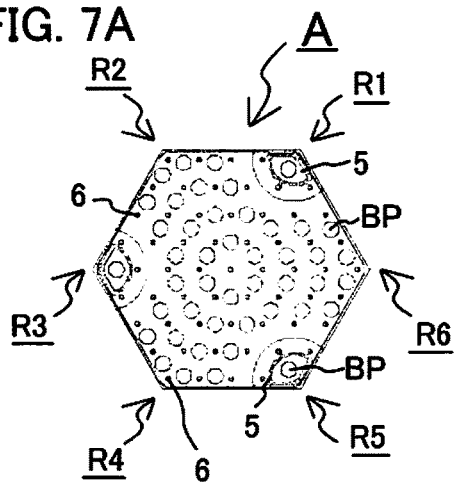
FIGS. 7A to 7F are schematic plan views illustrating the positions of the second p-electrodes in the light emitting element according to an embodiment of the present invention.

For example, with the light emitting element A shown in FIG. 7A, the holes 6 are formed in three corners, indicated by R2, R4, and R6 (three non-adjacent corners), and are not formed in the three corners indicated by R1, R3, and R5 at mutually diagonal locations. With the light emitting element B shown in FIG. 7B, the holes 6 are also not formed in the corner indicated by R2, in addition to the three corners indicated by R1, R3, and R5 at mutually diagonal locations, and are formed in only the two corners indicated by R4 and R6. With the light emitting element C shown in FIG. 7C, the holes 6 are not formed in the corners R1, R3, and R5 at mutually diagonal locations and in the corner indicated by R6, and are formed in only the two corners indicated by R2 and R5. With the light emitting element D shown in FIG. 7D, the holes 6 are formed in the one corner indicated by R6, but are not formed in the two corners indicated by R2 and R4, in addition to the three corners indicated by R1, R3, and R5 at mutually diagonal locations. Here, however, the corner in which the holes 6 are formed may be any of them from R1 to R6. With the light emitting element E shown in FIG. 7E, the holes 6 are not formed in any of the corners, including the three corners indicated by R1, R3, and R5 at mutually diagonal locations.

In this Specification, as discussed above, the word "corner" refers to a fan-shaped area (see 7ni in FIG. 1B) in which two lines constituting the outer edge of the light emitting element and/or the n-side semiconductor layer and/or the p-side semiconductor layer in plan view intersect at 120 degrees±5 degrees, and these two lines are formed as two sides of the area. However, as long as it includes this fan-shaped region, it may be an area that includes a part extending somewhat toward the inside (see 27n in FIGS. 2 and 47ni in FIG. 4B). These two lines are preferably no more than about one-third the length of the sides forming the hexagon, and more preferably no more than about one-fourth the length.

As discussed above, the holes 6 are holes that expose the n-side semiconductor layer. The plurality of places on the n-side semiconductor layer exposed by the holes can be used to make an integral electrical connection with the n-side semiconductor layer by means of the n-electrode (discussed below).

The number, size, shape, and positions of the holes can be suitably set according to the size, shape, connection state, and so forth of the intended light emitting element.

The holes are preferably all arranged in the same size and the same shape. This affords a uniform amount of current supply. As a result, the emission intensity can be more even, and uneven brightness can be suppressed for the light emitting element as a whole.

Examples of the shape of the holes in plan view include circular or elliptical, and triangular, rectangular, hexagonal, and other such polyhedral shapes, of which circular or elliptical is preferable. The size of the holes can be suitably adjusted as dictated by the size of the semiconductor layer and the required output, brightness, and so forth of the light emitting element. The diameter (or one side) of the holes is preferably about a few dozen to a few hundred microns. From another standpoint, the diameter is preferably about 1/20 to 1/5 the length of one side of the semiconductor layer. From yet another standpoint, the size can be suitably adjusted according to the total surface area occupied by the holes. More specifically, an example is a total surface area of about 1/100 to 1/20 with respect to the surface area of the light emitting element. In other words, this can range from about 2000 µm² to about 0.5 µm². The number of holes is, for example, about 2 to 100, with about 4 to 80 being preferable.

As shown in FIG. 1A, for example, a plurality of holes are preferably disposed along the sides of the p-side semiconductor layer in plan view. In this case, it is more preferable for adjacent holes to be evenly spaced apart. However, the spacing may be different between some of the holes. The term "evenly spaced apart" here is not limited to when the holes are all disposed at the same spacing, and also permits their spacing to vary within a range of about ±5%. The shortest distance between holes (hereinafter referred to as the center distance between holes) is, for example, about 2 to 8 times the size (such as the diameter) of the holes, and a distance of about 4 to 6 times is preferable. More specifically, in the case that the p-side semiconductor layer has holes with a diameter of about 50 µm, the shortest distance is about 100 to 400 µm, and preferably about 200 to 300 µm, for example.

This hole layout controls the amount of current injected into the n-side semiconductor layer, and improves emission efficiency.

First p-Electrode, Second p-Electrodes and n-Electrode

The light emitting element includes at least a first p-electrode 4, second p-electrodes 5 and an n-electrode 7.

The electrodes can be formed by, for example, a metal such as Ag, Au, Pt, Pd, Rh, Ni, W, Mo, Cr, Ti, Al, Cu, or an alloy, further for example, a single layer film or a multilayer film by a light-transmissive conductive film containing at least one element selected from the group including Zn, In, Sn, Ga and Mg. Examples of the transparent conductive film include, for example, ITO, ZnO, IZO, GZO, $In_2O_3$ and $SnO_2$.

The first p-electrode 4 is provided on the p-side semiconductor layer, in contact with the p-side semiconductor layer. The first p-electrode is an ohmic electrode layer, but can also function as a light reflecting electrode layer, for example. Accordingly, it is better for the first p-electrode to have a larger contact surface area with the p-side semiconductor layer, and is preferably formed, for example, over at least 50%, and more preferably at least 60%, and even more preferably at least 70% of the surface area of the semiconductor layer. Further, it is preferably formed on substantially the entire surface including the above-mentioned corners.

The light reflecting electrode layer can be formed by a layer containing silver, a silver alloy, or the like (silver-containing layer). The layer of silver or a silver alloy is preferably disposed in contact with the semiconductor layer or at the location closest to the semiconductor layer. Any material known in this field may be used as the silver alloy. There are no particular restrictions on the thickness of the light reflecting electrode layer, but it preferably is thick enough to allow light emitted from the semiconductor layer to be effectively reflected, such as about 20 nm to 1 µm. To prevent the migration of silver, it is preferable to dispose an insulating layer or a conductive layer that covers the upper surface of this light reflecting electrode layer (and preferably the upper and side surfaces).

This extra conductive layer can be formed by a laminated film or a single-layer film composed of one of the metals listed above as electrode materials or an alloy thereof. For instance, it can be a single-layer film containing at least Al, Cu, Ni, or another such metal, or a laminated film of Ni/Ti/Ru, Ni/Ti/Pt, or the like. The thickness of the conductive layer may be from a few hundred nanometers to a few microns in order to effectively prevent the migration of silver.

Also, the migration of silver can be prevented by forming an insulating film of SiN, $SiO_2$, or the like so as to cover the side surfaces of the light reflecting electrode layer and be partially open on the upper surface of the light reflecting electrode layer. The insulating film may be either a single-layer film or a laminated film.

Examples of the ohmic electrode layer include single-layer film and laminated films composed of the above-mentioned light-transmissive conductive films.

The second p-electrodes are disposed on the first p-electrode in the corners in plan view. The second p-electrodes are not, however, disposed in the area where the holes are disposed. As discussed above, the second p-electrodes are disposed in three corners at mutually diagonal locations where no holes are disposed. However, as long as the second p-electrodes are disposed in these three corners at mutually diagonal locations, they may also be disposed in other corners where no holes are disposed.

Figure 7D:
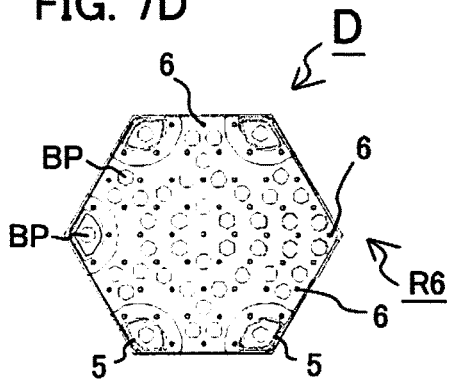
Figure 7B:
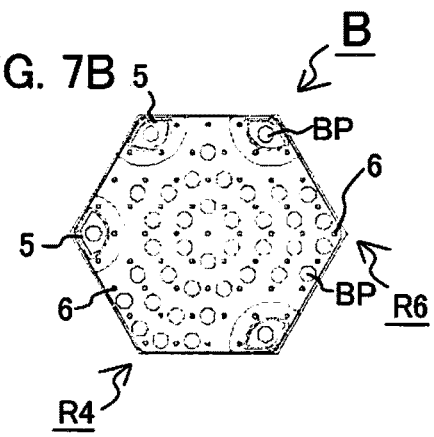
Figure 7E:
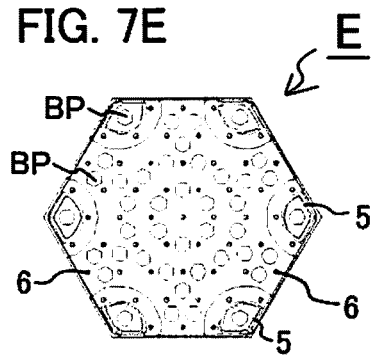

That is, the second p-electrodes are preferably disposed in three or more of the six corners of the light emitting element. As shown in FIG. 7A, when the second p-electrodes are disposed in three corners, they are preferably disposed in three non-adjacent corners, or in other words, in three corners at mutually diagonal locations. As shown in FIG. 7B, when the second p-electrodes are disposed in four corners, they are preferably disposed in one extra corner in addition to the three corners at mutually diagonal locations. As shown in FIGS. 7D and 7E, when the second p-electrodes are disposed in five or six corners, they may be disposed in any of the corners, and preferably are disposed so that two corners where no second p-electrodes are disposed are not adjacent (see FIGS. 7B and 7C). It is particularly preferable for the second p-electrodes to be disposed in either three non-adjacent corners or in six corners, which affords excellent uniformity in current density distribution, and it is especially good for them to be disposed in six corners because this further enhances light extraction from the area to the inside bounded by the corners.

The second p-electrodes preferably have a fan shape (in plan view) in which the corner consists of two lines that intersect at an angle of 120±5 degrees, and these two lines form the two sides, or a shape that is similar to this fan shape, or a shape that includes one of these shapes (hereinafter sometimes referred to as "fan-shaped, etc."). The two lines have a length of no more than 40% of the length of the sides forming the hexagon, with about 35% or less being preferable, about 30% or less even better, about 25% or less better yet, about 20% or less better yet, and about 15% or less still better. In other words, an example is a shape that is fan-shaped, etc., in which one side measures about 30 to 300 µm, or one side measures about 100 to 300 µm.

The n-electrode is provided on the first p-electrode. The n-electrode is not provided on the second p-electrodes, and is disposed apart from the second p-electrodes in plan view. Also, the n-electrode is electrically connected to the n-side semiconductor layer through the above-mentioned plurality of holes. The n-electrode may be divided up into a plurality of electrodes, but preferably one n-electrode is connected to the n-side semiconductor layer via the plurality of holes so that the connection area can be expanded in mounting and current can be supplied uniformly.

Examples of the second p-electrode and/or the n-electrode include, in particular, from the semiconductor layer side, Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Ti/Rh, Ti/Rh/Ti/Pt/Au, Ag/Ni/Ti/Pt, Ti/ASC/Ti/Rt/Au (here, the ASC is a Al/Si/Cu alloy). Further, the semiconductor layer side of a laminated structure thereof, the above-mentioned light-transmissive conductive film may be disposed.

The n-electrode is preferably disposed from within the holes to over the p-side semiconductor layer, via an insulating film disposed in an area that extends on the p-side semiconductor layer and the side surfaces of the holes (the side surfaces of the p-side semiconductor layer and the active layer), from part of the exposed surface of the n-side semiconductor layer, which is the bottom surface of the holes provided in the p-side semiconductor layer. This insulating film is a single-layer or laminated film made from materials known in this field, and is preferably thick enough to ensure good electrical insulation.

All or part of the n-electrode in plan view may be slightly smaller than, the same as, or slightly larger than the n-side semiconductor layer. Also, the n-electrode preferably has an opening corresponding to a fan shape or the like so as to provide isolation from the second p-electrodes in plan view.

Also, a dielectric multilayer film, such as a DBR (distributed Bragg reflector) film may be included between the n-electrode and the second p-electrodes, and between the n-side semiconductor layer and the p-side semiconductor layer.

Embodiment 2: Light Emitting Element

Embodiment 2 has the substantially the same configuration as the light emitting element in Embodiment 1, except that the positions of the second p-electrodes and the positions of the holes 6 in the light emitting element are different.

Holes

Figure 7C:
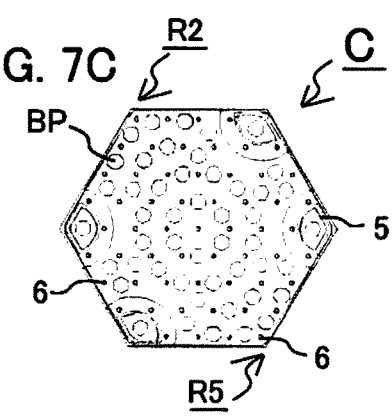
Figure 7F:
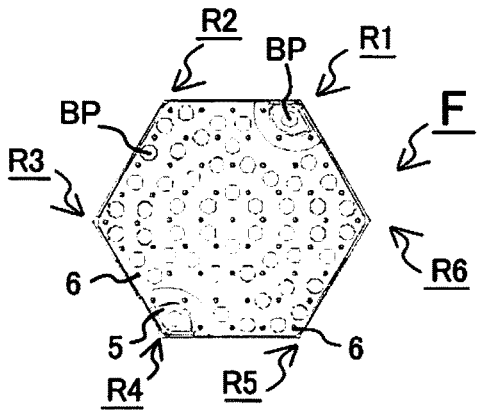

With this light emitting element, as shown in FIG. 7F, a plurality of holes are provided in an area that excludes two corners located farthest apart in the p-side semiconductor layer in plan view, such as R1 and R4 in FIG. 7F, and expose the n-side semiconductor layer.

The phrase "two corners located farthest apart" here means corners that are disposed at the ends of the longest diagonal line.

The holes 6 may be formed in any area of the p-side semiconductor layer, so long as they are provided in an area that excludes these two corners located farthest apart. In other words, in the case where the holes 6 are not even formed in these two corners located farthest apart, the holes 6 may not be formed in any corner adjacent to these two corners, or may not be formed in five corners including these two corners located farthest apart, or may not be formed in any of the corners. Again in these cases, the holes are preferably formed in an area of the p-side semiconductor layer other than the corners, and particularly in an area to the inside that is bounded by at least two corners, as this increases the amount of light extraction from the upper surface of the light emitting element (and particularly the area to the inside that is bounded by two corners).

For instance, with the light emitting element F shown in FIG. 7F, the holes 6 are not formed in the two corners indicated by R2 and R5 that are located farthest apart, and are formed in the four corners indicated by R1, R3, R4, and R6. Also, with the light emitting element B shown in FIG. 7B, the holes 6 are not formed in the corners indicated by R1 and R3 in addition to the two corners indicated by R2 and R5 that are located farthest apart, and are formed in the two corners indicated by R4 and R6. Also, with the light emitting element C shown in FIG. 7C, the holes 6 are not formed in the corners indicated by R1 and R4 in addition to the two corners indicated by R3 and R6 that are located farthest apart, and are formed in the two corners indicated by R3 and R5. Also, with the light emitting element C shown in FIG. 7D, the holes 6 are formed in the one corner indicated by R6, but are not formed in the corner indicated by R3 in addition to the four corners indicated by R2 and R5, and by R1 and R4, which are located farthest apart. Here, however, the corner in which the holes 6 are formed may be either R1 to R6. Also, with the light emitting element E shown in FIG. 7E, the holes 6 are not formed in any of the corners, including the six corners indicated by R2 and R5, R1 and R4, and R3 and R6 that are located farthest apart.

Second p-Electrodes

The second p-electrodes are disposed in the corners on the first p-electrode. However, the second p-electrodes are not disposed in the area where the holes are disposed. As discussed above, the second p-electrodes are disposed in two corners located farthest apart in which no holes are disposed. However, as long as the second p-electrodes are disposed in two corners located farthest apart, they may further be disposed in corners in which no holes are disposed.

That is, the second p-electrodes are preferably disposed in two or more of the six corners of the light emitting element. When the second p-electrodes are disposed in two corners, the second p-electrodes are preferably disposed in two corners located farthest apart, as shown in FIG. 7F. When the second p-electrodes are disposed in four corners, the second p-electrodes are preferably disposed in two corners located farthest apart as well as in any two corners adjacent to these two corners, as shown in FIGS. 7B and 7C. That is, the second p-electrodes are preferably disposed so that the two corners in which the second p-electrodes are not disposed are not adjacent to each other. When the second p-electrodes are disposed in five or six corners, the second p-electrodes may be disposed in any of the corners as shown in FIGS. 7D and 7E. It is particularly preferable for the second p-electrodes to be disposed in all six corners.

With the light emitting element of Embodiment 2 configured as above, emission is kept to a minimum in the corners of the area in which the second p-electrodes are disposed, and in the surrounding areas, and light extraction from the upper surface of the light emitting element can be further improved.

Embodiment 3: Light Emitting Device

Figure 8A:
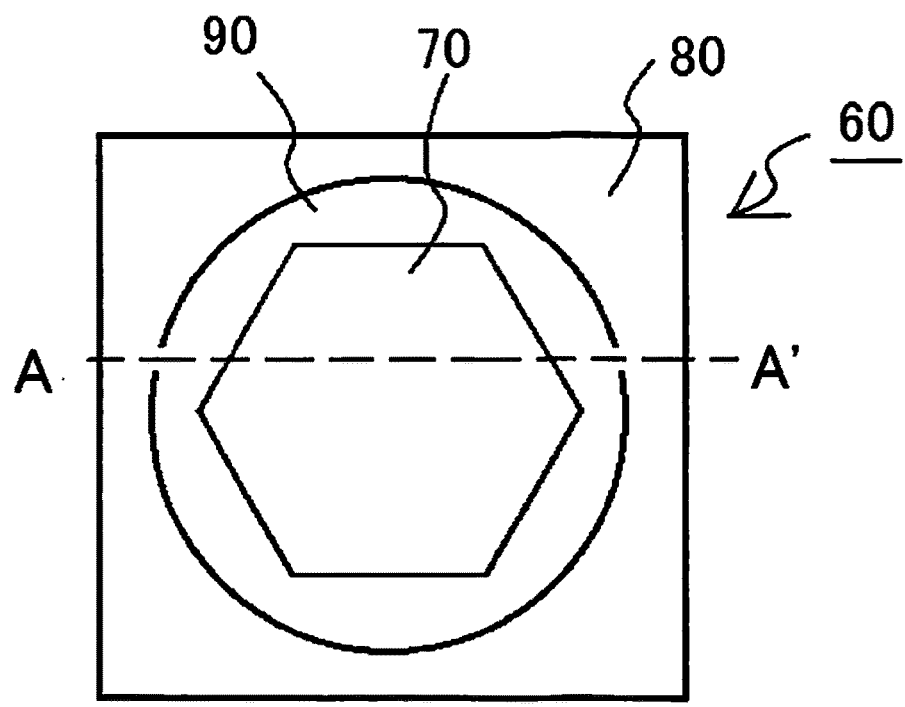
FIG. 8A is a schematic plan view of the configuration of a light emitting device featuring the light emitting element according to an embodiment of the present invention.
Figure 8B:
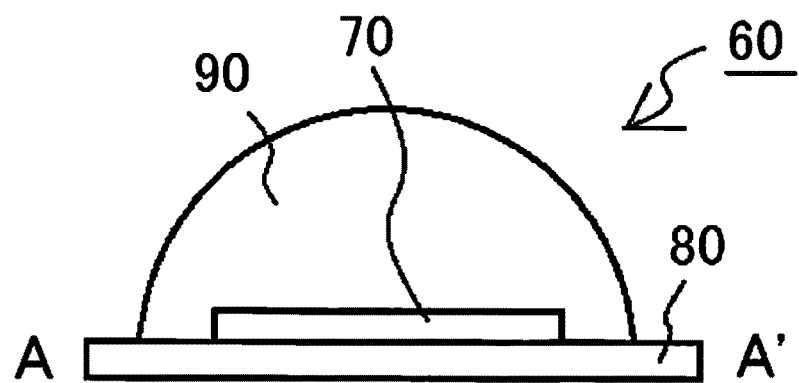
FIG. 8B is a cross sectional view along the A-A' line in FIG. 8A.

As shown in FIGS. 8A and 8B, the light emitting device in an embodiment of the present invention has the above-mentioned light emitting element 70, a base 80 on which the light emitting element 70 is provided, and a hemispherical light-transmissive member 90 that covers the light emitting element.

With this light emitting device, optionally, functional members that has optically reflective, light-transmissive, light-blocking, and/or light converting properties etc., may be disposed on the side surfaces, upper surface, lower surface, etc., of the light emitting element, etc. (as well as the side surfaces, upper surface, or lower surface of the base). For example, a phosphor layer may be formed by electrode-position, spraying or the like on the side surfaces and upper surface of the light emitting element. Further, an optical member such as lens, that covers the hemispherical light-transmissive member 90 may be disposed.

Base

The base, for example, has a plurality of wiring patterns on the front surface, and optionally, in the interior and/or on the rear surface, of a base material composed of metal, ceramic, resin, dielectric, pulp, glass, paper, or a composite of these materials (such as a composite resin), or a composite of these materials and an electroconductive material (such as metal or carbon).

The wiring patterns may be capable of supplying current to the light emitting element, and are formed from a material and in a thickness, shape, and so forth that are commonly used in this field. As long as the wiring patterns include a pair of positive and negative patterns connected to the electrodes of the light emitting element (the second p-electrodes and the n-electrode), they may also have another pattern disposed independently from the pair of positive and negative patterns.

The mounting of the light emitting element on the base is preferably performed with a joining member such as bumps or solder. The joining member can be any material that is known in this field.

Light-transmissive Member

The light-transmissive member covers the light emitting element and serves as a lens. To this end, it is preferably hemispherical in shape. However, this hemispherical shape need not be exactly half of an exact sphere, and may also have a partial cross section that is oblate, prolate spheroid, egg-shaped, spindle-shaped, or the like.

The light-transmissive member may be formed from glass or the like, but is preferably formed form a resin. Examples of resins include thermosetting resins, thermoplastic resins, these resins that have been modified, and hybrid resins including one or more of these resins.

Functional Member

Examples of the functional member include a lens, a phosphor layer and other members given any functions. One functional member or a plurality of functional members may be disposed on one light emitting element, or one functional member may be disposed on a plurality of the light emitting elements.

Example of the lens include, for example, concave and convex lenses, and Fresnel lenses. Such lenses can be used those produced by known production methods with the materials known in the art. A light diffusion material or the like may be contained in the lens. Examples of the light diffusion material include a fibrous filler such as glass fibers, wollastonite, an inorganic filler such as aluminum nitride, carbon, silica, titanium oxide, zirconium oxide, magnesium oxide, glass, crystal or sintered body of a phosphor, a sintered body of a phosphor and a bonding material of an inorganic material.

A protective film, a reflective film, an anti-reflection film or the like may be formed on the light incident surface and/or light exit surface of the lens. Examples of the antireflection film include four-layered structure film formed of silicon dioxide and zirconium dioxide.

Any phosphor that is known in this field can be used. More specifically, examples include cerium-activated yttrium•aluminum•garnet (YAG), cerium-activated lutetium•aluminum•garnet (LAG), europium- and/or chromium-activated nitrogen-containing calcium aluminosilicate ($CaO$—$Al_2O_3$—$SiO_2$), europium-activated silicates (($Sr,Ba)_2SiO_4$), β-sialon phosphors, nitride-based phosphors such as CASN-based or SCASN-based phosphors, KSF-based phosphors ($K_2SiF_6$:Mn) and sulfide-based phosphors, as well as a luminescent material referred to as a so called nanocrystal or quantum dot. Examples of the luminescent material include a nano-size high-dispersive particles of semiconductor materials, for example group II-VI, group III-V and group IV-VI semiconductors, more specifically CdSe, core-shell type $CdS_XSe_{1-X}$/ZnS, GaP, InP, and GaAs. These may be used singly or in combinations of two or more.

As light emitting devices have become smaller in recent years, and the light-transmissive member covering the light emitting element have also become smaller, the surface of the light-transmissive member has moved closer to the light emitting element, and as a result, the light-transmissive member provides no lens effect, and more light escapes to the side of the light emitting device, so the light extraction from above the light emitting device may not be obtained at the desired efficiency. In contrast, in the case where a light emitting element that is hexagonal in plan view is covered by the light-transmissive member as in this embodiment, the distance between the light emitting element and the surface of the light-transmissive member can be better ensured than with a light emitting element that is square in plan view and has the same surface area. Thus, the lens effect provided by the light-transmissive member can be utilized effectively. Also, the light emitting element according to this embodiment has a structure that suppresses emission at the corners, or to put this another way, a structure that increases the amount of current supplied to the area other than the corners, rather than suppressing the supply of current to the semiconductor layer at the corners. Consequently, less light escapes to the side of the light emitting device from the corners of the light emitting element which tend to be closer to the surface of the light-transmissive member, and the lens effect of the light-transmissive member can be utilized more effectively, so light can be efficiently extraction above the light emitting device.

Examples of a light emitting element and a light emitting device in which this element is used will now be described in detail through reference to the drawings.

EXAMPLE 1

Light Emitting Element

As shown in FIGS. 1A to 1D, the light emitting element 10 in this example is hexagonal in plan view. This light emitting element 10 has the n-side semiconductor layer 2n, the p-side semiconductor layer 3p, the first p-electrode 4p, the second p-electrodes 5p, and the n-electrode 7n. One side of the light emitting element 10 measures approximately 1.2 mm in length.

The semiconductor layer is configured by laminating the n-side semiconductor layer 2n, an active layer Ac, and the p-side semiconductor layer 3p in that order over a hexagonal sapphire substrate 8. The semiconductor layer has an area around its outermost periphery in which part of the p-side semiconductor layer 3p and the active layer Ac are removed to expose the n-side semiconductor layer 2n.

The p-side semiconductor layer 3p has a plurality of holes 6. The active layer Ac present under these holes 6 is also removed to expose the n-side semiconductor layer 2n. However, the p-side semiconductor layer 3p here is such that no holes are disposed in three non-adjacent corners of the hexagon or the surrounding areas, and the holes 6 are provided in the area that excludes these corners and their surrounding areas.

The holes 6 are substantially circular, have a diameter of approximately 27 μm, and 58 of them are formed, for example. The holes 6 are arranged in rows that are substantially parallel to the sizes of the hexagon in plan view, and their center distance is approximately 300 μm. The total surface area of the holes 6 is 0.92% of the surface area of the semiconductor layer, or approximately 33,000 μm².

The first p-electrode 4p is disposed in contact with the p-side semiconductor layer 3p, on substantially the entire surface except for the holes 6. The term "substantially the entire surface" here means the area other than the outer edge on the upper surface of the p-side semiconductor layer 3p and the inner edge near the holes 6. For example, the first p-electrode 4p is preferably provided to at least 90% of the upper surface of the p-side semiconductor layer 3p. The first p-electrode 4p has a silver-containing layer formed over substantially the entire surface of the p-side semiconductor layer 3p, a layer that covers the upper surface of this silver-containing layer, and an insulating layer 4a composed of SiN that covers the side surfaces and part of the upper surface of the silver-containing layer. The layer that covers the silver-containing layer is formed by a laminated film of layers of nickel, titanium, and platinum, starting from the semiconductor layer side. This laminar structure allows the light emitted from the active layer Ac to be reflected to the sapphire substrate 8 side, and improves light extraction efficiency. Also, the migration of silver can be effectively prevented by the insulating layer 4a and the layer that covers the silver-containing layer.

The second p-electrodes 5p is disposed on the first p-electrode 4p in an area that includes the three corners in which the holes 6 are not disposed and their surrounding areas. The second p-electrodes 5p have a fan shape with two sides each substantially parallel to one of the two sides of the p-side semiconductor layer 3p constituting the area that includes the provided corner and its surrounding area. The two sides of the fan shape are about one-fifth the length of one side of the p-side semiconductor layer 3p, or approximately 300 μm.

The n-electrode 7n, which is electrically connected to the n-side semiconductor layer 2n through the holes 6, is disposed over the first p-electrode 4p. In FIG. 1B, "7no" is the outer periphery of the n-electrode 7n, and "7ni" is the inner periphery. The first p-electrode 4p is disposed above the first p-electrode 4p other than at the second p-electrodes 5p and their surroundings, via an insulating film 9 composed of SiO₂. The insulating film 9 is disposed over the side surfaces of the holes 6 and part of the area of the exposed n-side semiconductor layer 2n (the upper surface of the n-side semiconductor layer 2n). The insulating film 9 has openings 9a over part of the area of the first p-electrode 4p disposed over the p-side semiconductor layer 3p, that is, that expose the upper surface of the first p-electrode 4p at the connections between the first p-electrode 4p and the second p-electrodes 5p. The insulating film 9 also covers the n-side semiconductor layer 2n exposed by removing part of the active layer Ac and the p-side semiconductor layer 3p around the outermost periphery of the light emitting element 10.

The second p-electrodes 5p and the n-electrode 7n are both formed by a laminated film of Ti/Al—Si—Cu alloy/Ti/Pt/Au, starting from the semiconductor layer side.

Figure 1E:
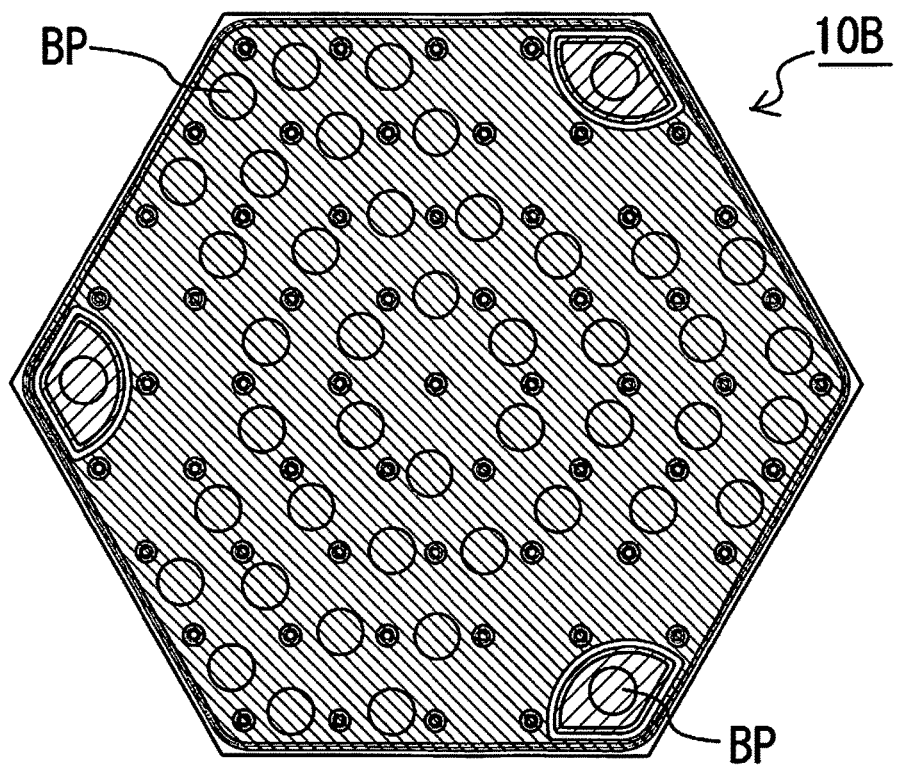
FIG. 1E is a schematic plan view of the partial configuration of the light emitting device according to an embodiment of the present invention, including the light emitting element in FIG. 1A.
Figure 1F:
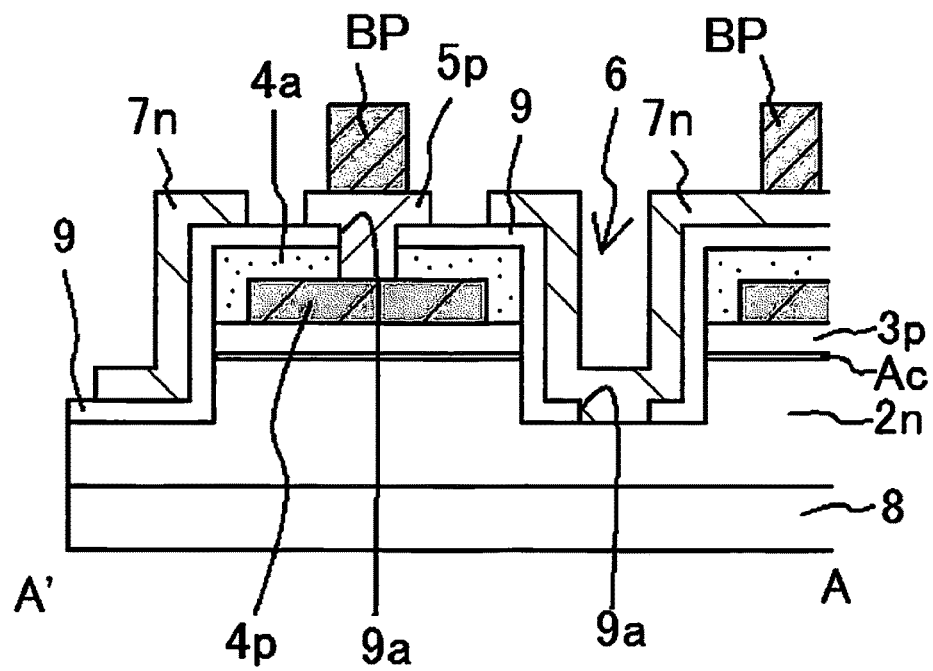
FIG. 1F is a cross sectional view along the A-A' line in FIG. 1E.

As shown in FIGS. 1E and 1F, when this light emitting element 10 is used to manufacture a light emitting device, one bump electrode BP that connects to a second p-electrode 5p is formed for each second p-electrode 5p, and a plurality of bump electrodes BP that connect to the n-electrode 7n are formed uniformly over the entire surface. The bump electrodes BP connecting to the n-electrodes 7 are preferably formed at positions that do not overlap with the holes 6 in plan view so that the insulating film 9 will not be broken by excessive load when the light emitting element 10 is mounted.

EXAMPLE 2

Light Emitting Element

As shown in FIG. 2, the light emitting element 20 in Example 2 has substantially the same configuration as the light emitting element 10 in Example 1, except that the second p-electrodes 25p are not fan-shaped, and instead have a shape having two portions that extend somewhat to the inside from the fan shape.

EXAMPLE 3

Light Emitting Element

Figure 3:
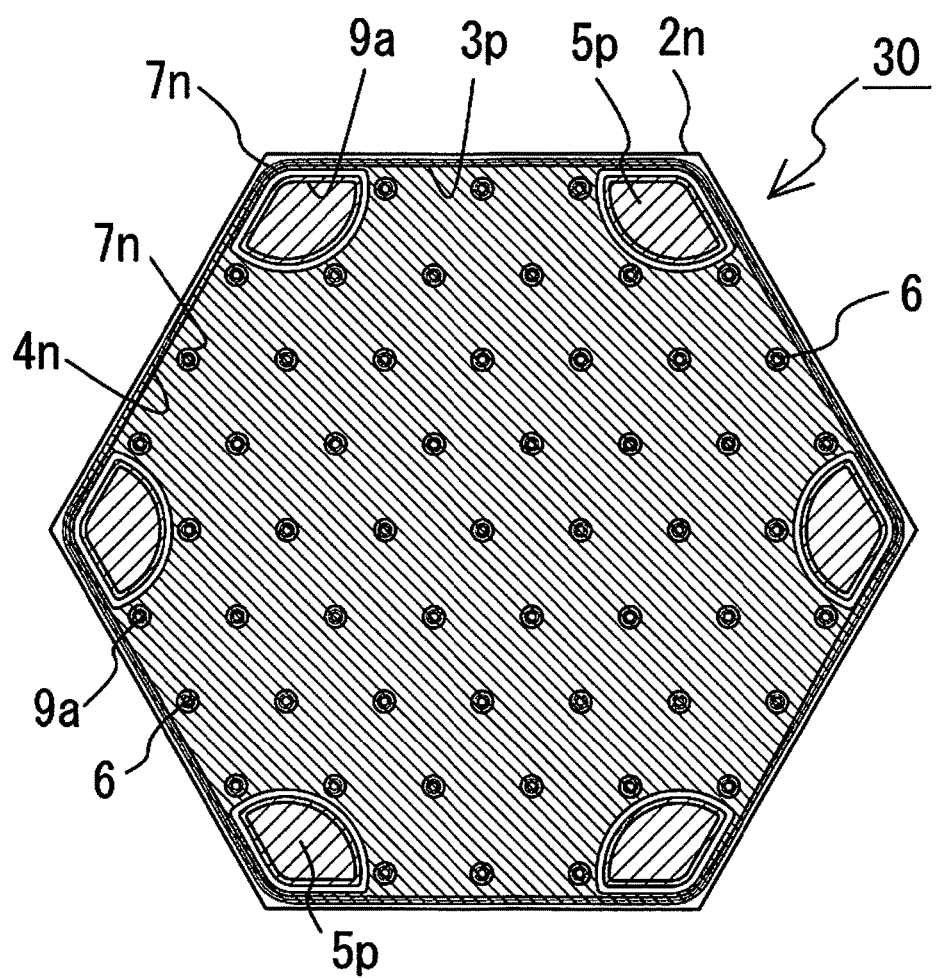
FIG. 3 is a schematic plan view of the configuration of the light emitting element according to still another embodiment of the present invention.

As shown in FIG. 3, the light emitting element 30 in Example 3 is such that the fan-shaped second p-electrodes 5p are disposed in all of the corners and their surrounding areas. Thus, the holes 6 are not disposed in any of the six corners of the p-side semiconductor layer 3p or their surrounding areas, and there are only 55 holes. Therefore, the total surface area of the holes 6 is about 0.87% of the surface area of the semiconductor layer, or approximately 3100 $\mu m^2$.

Other than the above, the configuration is substantially the same as that of the light emitting element 10 in Example 1.

EXAMPLE 4

Light Emitting Element

Figure 4A:
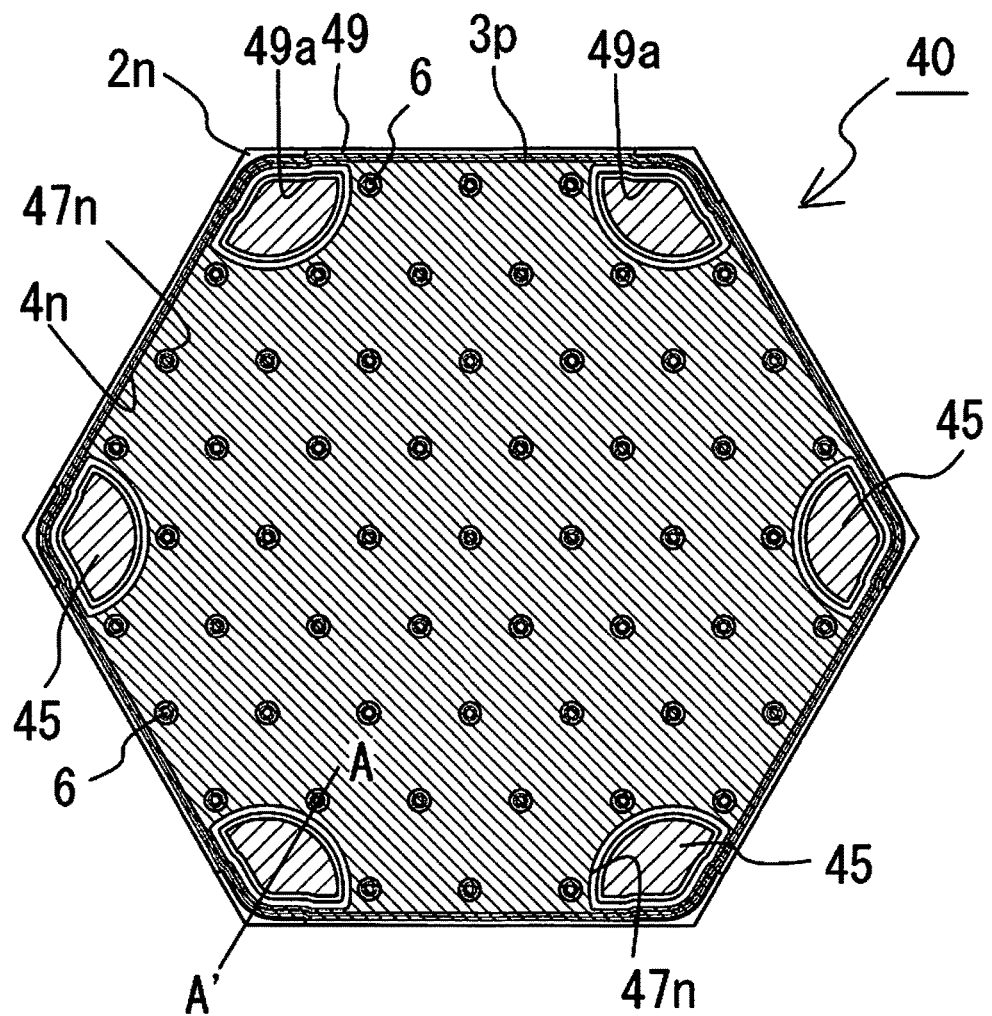
FIG. 4A is a schematic plan view of the configuration of the light emitting element according to still another embodiment of the present invention.
Figure 4B:
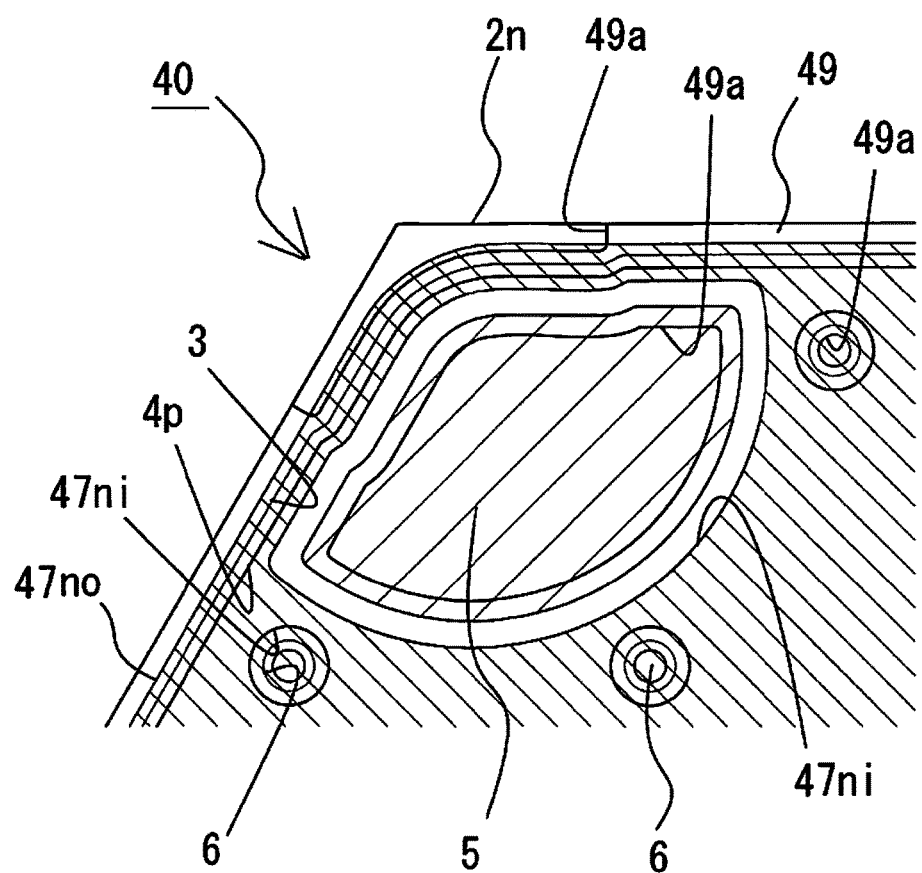
FIG. 4B is an enlarged plan view of the main parts of the light emitting element in FIG. 4A.
Figure 4C:
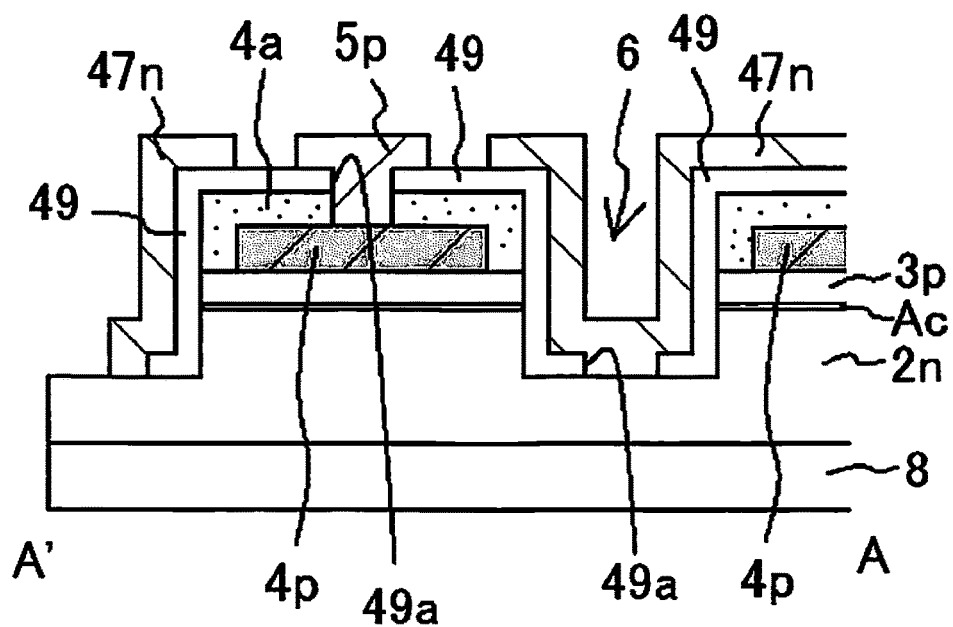
FIG. 4C is a cross sectional view along the A-A' line in FIG. 4A.

As shown in FIG. 4, the light emitting element 40 in Example 4 as an area around its outermost periphery in which parts of the active layer Ac and the p-side semiconductor layer 3p are removed to expose the n-side semiconductor layer 2n, and in the corners has areas that are not covered by the insulating film 9. Substantially fan-shaped second p-electrodes 45p that are recessed on the outside are disposed in the area that includes all of the corners and their surrounding areas. At the corners in which the second p-electrodes 45p are disposed, part of the n-electrode 7n is in contact with and electrically connected to the n-side semiconductor layer 2n in the area not covered by the insulating film 9.

Other than the above, the configuration is substantially the same as that of the light emitting element 30 in Example 3.

Evaluation of Light Emitting Element

Figure 5A:
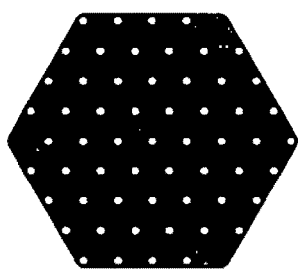
FIGS. 5A to 5C show the simulated results for the current density distribution in the light emitting element according to an embodiment of the present invention.
Figure 5B:
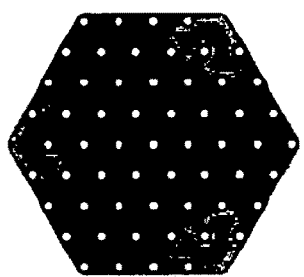
Figure 5C:
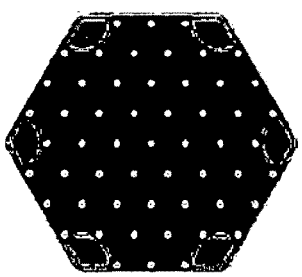

The distribution of current density in the light emitting elements 10, 20, and 30 in Examples 1 to 3 was analyzed by simulation software that made use of the finite elements method. The results are shown in FIGS. 5A to 5C, respectively. In FIGS. 5A to 5C, the darker is the shading, the higher is the current density.

Figure 6A:
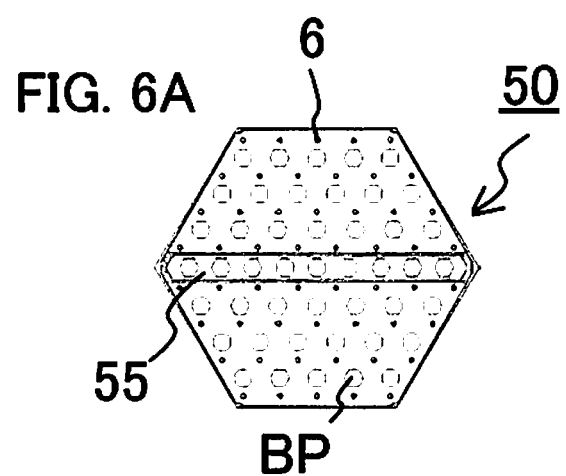
FIGS. 6A and 6B show the simulated results for the current density distribution in a light emitting element used for reference.
Figure 6B:
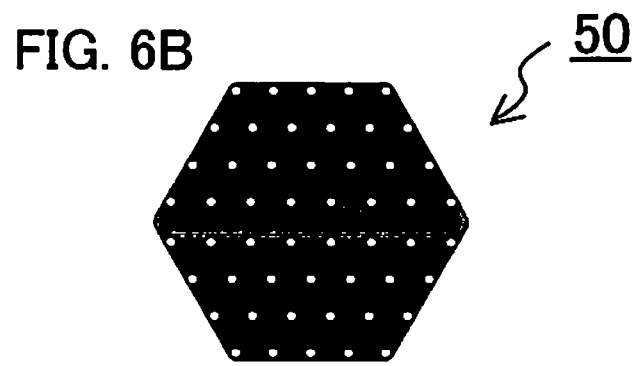

For the sake of reference, as shown in FIG. 6A, the distribution of current density was also analyzed for a light emitting element 40 having substantially the same configuration as the light emitting element 10, except that second p-electrodes 55 were disposed along a pair of diagonal lines. The results are shown in FIG. 6B.

It can be seen in FIGS. 5A to 5C that with the light emitting elements 10, 20, and 30, the current density in the area in which the second p-electrodes 5 are disposed can be reduced in the areas adjacent to the sides of the semiconductor layer and the area to the inside.

In particular, with the light emitting element 20, as the surface area of the second p-electrodes 25 is increased over that in the light emitting element 10, the current density can be reduced at the corners where the second p-electrodes 25 are disposed, while the current density can be increased in the area to the inside, and particularly the center area of the semiconductor layer.

Also, with the light emitting element 30, as the number of second p-electrodes 35 is increased to six, the current density can be reduced at the corners where the second p-electrodes 35 are disposed, while the current density can be increased more uniformly over the entire inside.

These phenomena indicate that the current density distribution can be increased more markedly in the area on the inside of the semiconductor layer than the current density distribution at the corners and the outer peripheral portions of the semiconductor layer in the light emitting element 50.

Also, the forward voltage Vf when a current of 350 mA was applied was analyzed for the light emitting elements 10, 20, and 30 by a simulation that made use of the finite elements method. The results are shown in Table 1 along with the number of holes, the total surface area of the area in which the n-electrode is connected to the n-side semiconductor layer via holes (the surface area of the n-side contact area), and the surface area of the first p-electrode (the surface area of the p-side contact area). The surface areas of the n-side contact area and the p-side contact area are given as relative values, using the surface area in the light emitting element 10 as 100%.

TABLE 1

|  | Light emitting element 10 | Light emitting element 20 | Light emitting element 30 |
| --- | --- | --- | --- |
| Forward voltage Vf (V) | 0.344 | 0.333 | 0.332 |
| Number of hole | 58 | 58 | 55 |
| Surface area of n-side contact area (%) | 100 | 100 | 94.8 |
| Surface area of p-side contact area (%) | 100 | 100 | 99.8 |

As shown in Table 1, with the light emitting elements 20 and 30, it was confirmed that the Vf values were reduced about 0.011 V (approximately 3.1%) and 0.012 V (approximately 3.5%) versus the light emitting element 10. With the light emitting element 20, the surface area of the p-side contact area is the same as in the light emitting element 10, but the surface area of the second p-electrodes is greater, and there was less concentration of current near the second p-electrodes, and this is what is believed to have caused the decrease in the Vf value. With the light emitting element 30, the number of second p-electrodes was raised from three to six versus the light emitting element 10 and the light emitting element 20, and the current was supplied to the semiconductor layer more uniformly, and this is believed to be what caused the decrease in the Vf value.

EXAMPLE 5

Light Emitting Device

As shown in FIGS. 8A and 8B, the light emitting device 60 of Example 5 has a light emitting element 70 that is hexagonal in plan view just as is the light emitting element 10 in Embodiment 1, and a base 80 having a pair of positive and negative wiring patterns (not shown) on the surface.

The light emitting element 70 is mounted face-down on the base 80, and the n-electrode and p-electrodes of the light emitting element 70 are connected via joining members to the wiring pattern of the base 80. Also, the light emitting element 70 is covered by a hemispherical light-transmissive member 90 composed of silicone resin or the like. The light-transmissive member 90 also covers part of the upper surface of the base 80 along with the light emitting element 70.

With this light emitting device, the lens effect provided by the light-transmissive member 90 is utilized more effectively, allowing light to be extraction efficiently above the light emitting device.

EXAMPLE 6

Light Emitting Device

Figure 9A:
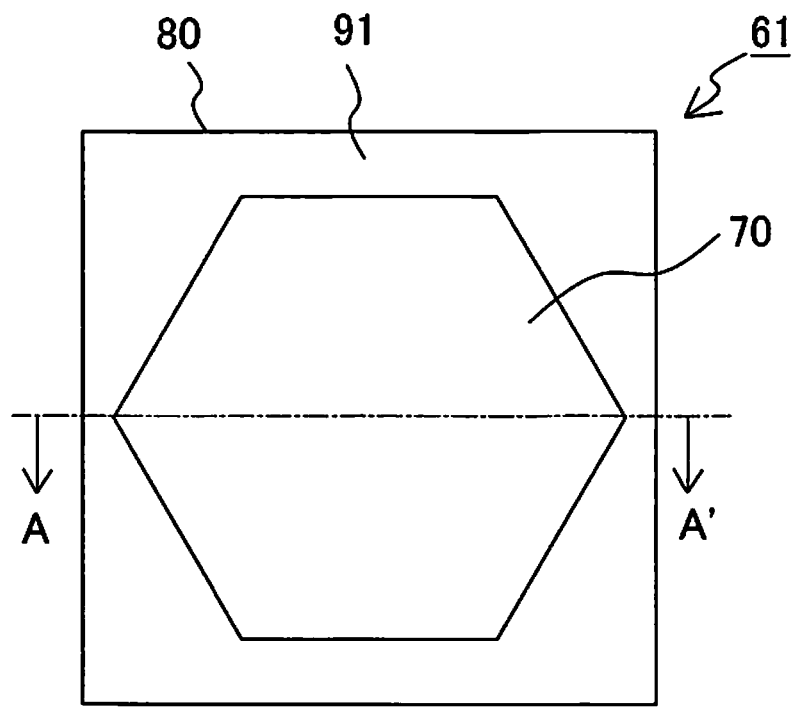
FIG. 9A is a schematic plan view of the configuration of another light emitting device featuring the light emitting element according to an embodiment of the present invention.
Figure 9B:
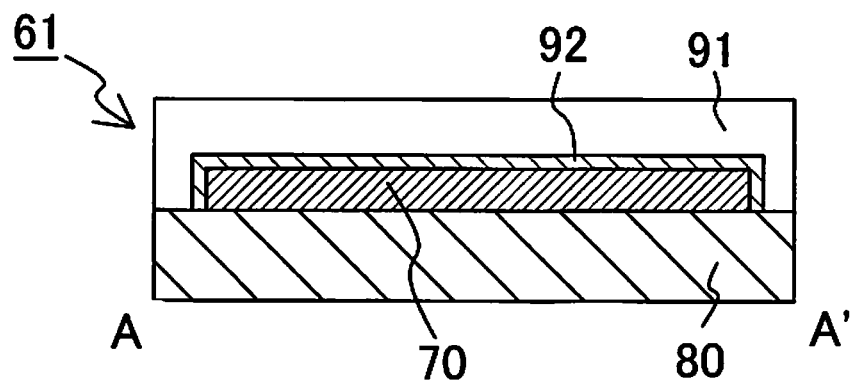
FIG. 9B is a cross sectional view along the A-A' line in FIG. 9A.

As shown in FIGS. 9A and 9B, the light emitting device 61 in Example 6 has a light emitting element 70 that is hexagonal in plan view just as is the light emitting element 10 in Embodiment 1, and a base 80 having a pair of positive and negative wiring patterns (not shown) on the surface. The light emitting element 70 is mounted face-down on the base 80, and its side surfaces and upper surface (the light extraction face) are covered by a phosphor layer 92 composed of YAG or the like. The surface of the light emitting element 70 covered by the phosphor layer 92 is covered in a substantially square shape by a light-transmissive member 91 composed of silicone resin or the like.

This light emitting device makes use of the wavelength conversion effect provided by the phosphor layer 92, and allows light of the desired color to be extraction efficiently.

EXAMPLE 7

Light Source Unit

Figure 10A:
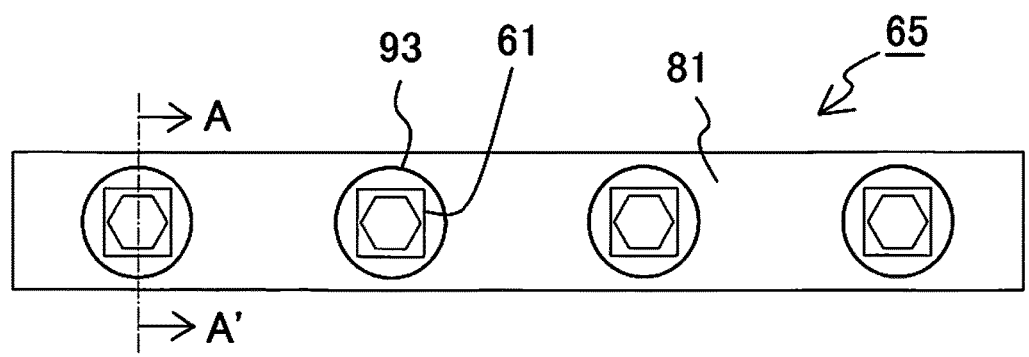
FIG. 10A is a schematic plan view of the configuration of a light source unit featuring the light emitting device of FIG. 9A.
Figure 10B:
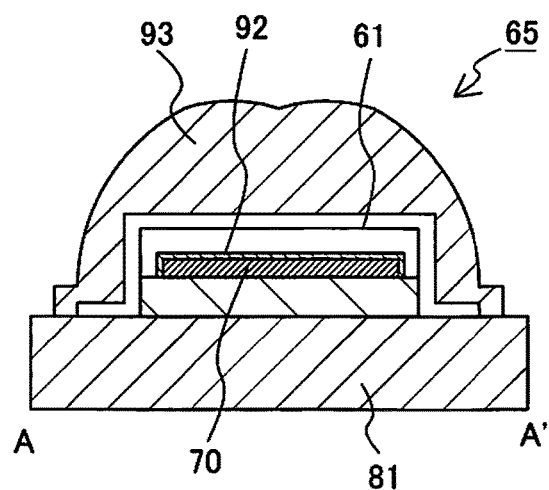
FIG. 10B is a cross sectional view along the A-A' line in FIG. 10A.

As shown in FIGS. 10A and 10B, the light source unit 65 in Example 7 has a circuit board 81, a plurality of light emitting devices 61 of Example 6 installed spaced apart on the circuit board 81, and a lens 93 that covers each of the light emitting devices 61. As shown in FIG. 10A, the lenses 93 may have a hemicycle shape in plan view capable of effectively using light from the light emitting device 61. As shown in FIG. 10B, the lenses 93 have a dent above the light emitting device 61 and on the upper surface which is opposite side of the lower surface facing the light emitting device 61, that allows light emitted from the light emitting devices 61 to be spread out, for example.

With this light source unit, the light emitting devices are disposed randomly or regularly, vertically and/or horizontally, and can be utilized as the light source for a backlight, or an illumination light source.

EXAMPLE 8

Light Source Unit

Figure 11A:
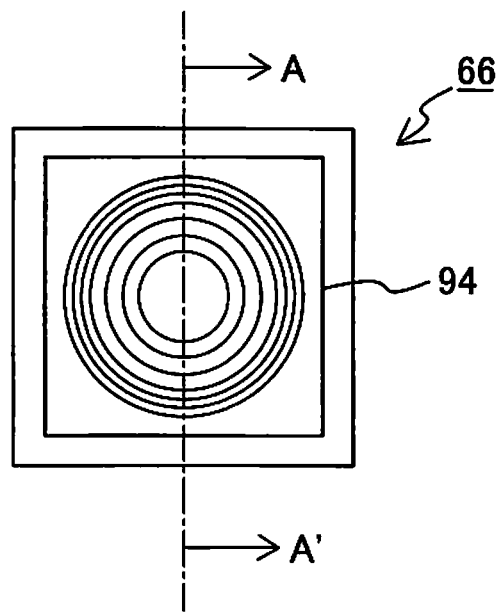
FIG. 11A is a schematic plan view of the configuration of another light source unit featuring the light emitting device of FIG. 9A.
Figure 11B:
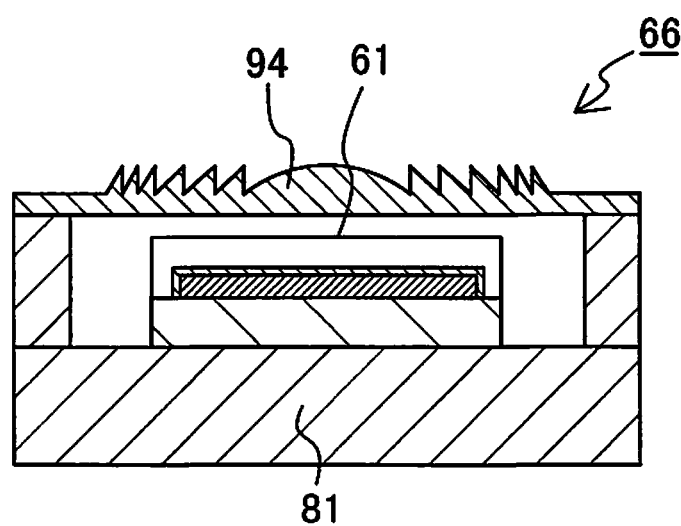
FIG. 11B is a cross sectional view along the A-A' line in FIG. 11A.

As shown in FIGS. 11A and 11B, the light source unit 66 in Example 8 has the circuit board 81, the light emitting devices 61 of Example 6 installed spaced apart on the circuit board 81, and Fresnel lenses 94 that covers these light emitting devices 61. The Fresnel lenses 94 here have a shape that allows the visibility to be reduced from the outside of the light emitting elements disposed inside the light emitting devices 61, or the phosphor layer disposed thereon, for example.

This light source unit can be utilized as a flash for a camera or the like.

The light emitting element and light emitting device according to embodiments and examples of the present invention can be suitably employed for various lighting apparatuses, in particular, a light source for lighting, flash of camera, backlight source for a liquid crystal display device, various kinds of indicators, a vehicle, sensor, signal automotive parts, signaling devices, or the like.

What is claimed is:

1. A light emitting element comprising:
an n-side semiconductor layer with a hexagonal planar shape;
a p-side semiconductor layer with a hexagonal planar shape provided on the n-side semiconductor layer;
a plurality of holes that are provided to an area excluding at least three corners at mutually diagonal positions of the p-side semiconductor layer out of six corners in plan view, and expose the n-side semiconductor layer;
a first p-electrode provided in contact with the p-side semiconductor layer;
second p-electrodes provided to three corners on the first p-electrode; and
an n-electrode that is provided on the first p-electrode and is electrically connected to the n-side semiconductor layer through the plurality of holes.

2. A light emitting element comprising:
an n-side semiconductor layer with a hexagonal planar shape;
a p-side semiconductor layer with a hexagonal planar shape provided on the n-side semiconductor layer;
a plurality of holes that are provided to an area excluding at least two corners at the farthest positions of the p-side semiconductor layer out of six corners in plan view, and expose the n-side semiconductor layer;
a first p-electrode provided in contact with the p-side semiconductor layer;
second p-electrodes provided to two corners on the first p-electrode; and
an n-electrode that is provided on the first p-electrode and is electrically connected to the n-side semiconductor layer through the plurality of holes.

3. The light emitting element according to claim 1, wherein
the plurality of holes are not provided to the six corners, including the area that excludes the at least three corners at mutually diagonal positions.

4. The light emitting element according to claim 2, wherein
the plurality of holes are not provided to the six corners, including the area that excludes the at least two corners at the farthest positions that are mutually opposite.

5. The light emitting element according to claim 3, wherein
the second p-electrodes are provided to the six corners on the first p-electrode.

6. The light emitting element according to claim 1, wherein
the second p-electrodes are fan-shaped, having two sides that are parallel to one of the two sides constituting the corner where each is provided.

7. The light emitting element according to claim 2 wherein
the second p-electrodes are fan-shaped, having two sides that are parallel to one of the two sides constituting the corner where each is provided.

8. The light emitting element according to claim 1, wherein
the plurality of holes are disposed along the sides of the p-side semiconductor layer in plan view.

9. The light emitting element according to claim 1, wherein
the n-electrode is provided from the portion electrically connected to the n-side semiconductor layer, via an insulating layer, to the first p-electrode.

10. The light emitting element according to claim 1, wherein
the insulating layer is a dielectric multilayer film.

11. The light emitting element according to claim 2, wherein
the insulating layer is a dielectric multilayer film.

12. The light emitting element according to claim 1, wherein
the first p-electrode includes a silver-containing layer touching the p-side semiconductor layer.

13. The light emitting element according to claim 2, wherein
the first p-electrode includes a silver-containing layer touching the p-side semiconductor layer.

14. The light emitting element according to claim 1, wherein
   the first p-electrode is formed of a light-transmissive conductive film.

15. The light emitting element according to claim 1, wherein
   the n-electrode is electrically connected to the n-side semiconductor layer via a light-transmissive conductive film in contact with the n-side semiconductor layer in the plurality of holes.

16. A light emitting device comprising:
   the light emitting element of claim 1,
   a base on which the light emitting element is provided, and
   a hemispherical light-transmissive member that covers the light emitting element.

17. The light emitting device according to 16, further comprising:
   a phosphor layer disposed between the light emitting element and the hemispherical light-transmissive member.

18. The light emitting device according to 16, further comprising:
   an optical member that covers the hemispherical light-transmissive member.

* * * * *

UNITED STATES PATENT AND TRADEMARK OFFICE
CERTIFICATE OF CORRECTION

PATENT NO. : 9,786,812 B2
APPLICATION NO. : 15/204395
DATED : October 10, 2017
INVENTOR(S) : Koichi Takenaga et al.

It is certified that error appears in the above-identified patent and that said Letters Patent is hereby corrected as shown below:

On the Title Page

And Page 2, please change the listing of [56] from:

(56) References Cited
U.S. PATENT DOCUMENTS
9,130,127 B2* 9/2015 Katsuno ............. H01L 33/22
2011/0266579 A1 11/2011 Nagai
2012/0049219 A1 3/2012 Kamiya et al.
2013/0176750 A1 7/2013 Ray et al.
2014/0183586 A1 7/2014 Kamiya et al.
2015/0098224 A1 4/2015 Hong et al.
2015/0179873 A1 6/2015 Wunderer et al.

To:
-- (56) References Cited
U.S. PATENT DOCUMENTS
9,082,931 B2* 7/2015 Katsuno et al.
9,130,127 B2* 9/2015 Katsuno ............. H01L 33/22
2011/0266579 A1 11/2011 Nagai
2012/0049219 A1 3/2012 Kamiya et al.
2013/0176750 A1 7/2013 Ray et al.
2014/0183586 A1 7/2014 Kamiya et al.
2015/0098224 A1 4/2015 Hong et al.
2015/0179873 A1 6/2015 Wunderer et al. --

Signed and Sealed this
Twenty-seventh Day of February, 2018

Andrei Iancu
*Director of the United States Patent and Trademark Office*